United States Patent
Shimizu et al.

(10) Patent No.: US 7,577,176 B2
(45) Date of Patent: Aug. 18, 2009

(54) SURFACE EMITTING LASER DEVICE

(75) Inventors: Hitoshi Shimizu, Tokyo (JP); Takeo Kageyama, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 12/040,348

(22) Filed: Feb. 29, 2008

(65) Prior Publication Data

US 2008/0212633 A1 Sep. 4, 2008

(30) Foreign Application Priority Data

Mar. 1, 2007 (JP) ............................. 2007-052006

(51) Int. Cl.
*H01S 5/20* (2006.01)
*H01S 5/00* (2006.01)

(52) U.S. Cl. .............................. 372/45.011; 372/45.01; 372/46.013

(58) Field of Classification Search ............ 372/44.011, 372/45.01, 45.011, 46.013, 46.015
See application file for complete search history.

(56) References Cited

FOREIGN PATENT DOCUMENTS

| JP | 3020167 B2 | 1/2000 |
|---|---|---|
| JP | 2005-252032 | 9/2005 |
| JP | 2007-258581 | 10/2007 |
| JP | 2007-311632 | 11/2007 |

OTHER PUBLICATIONS

A.W. Jackson, et al., "OC-48 capable InGaAsN verical cavity lasers", Electronics Letters. vol. 37 No. 6, pp. 355-356, Mar. 15, 2001.
U.S. Appl. No. 12/040,348, filed Feb. 29, 2008, Shimizu, et al.
U.S. Appl. No. 12/056,790, filed Mar. 27, 2008, Kageyama, et al.
U.S. Appl. No. 12/108,931, filed Apr. 24, 2008, Iwai, et al.

*Primary Examiner*—Armando Rodriguez
(74) *Attorney, Agent, or Firm*—Oblon, Spivak, McClelland, Maier & Neustadt, P.C.

(57) ABSTRACT

An optical resonator including a lower multilayer reflector and an upper multilayer reflector is arranged on a substrate. A strained active layer having a multiple quantum well structure formed with a quantum well layer and a barrier layer is arranged in the resonator. A current confinement layer including a selectively oxidized portion is arranged on an upper side of the strained active layer. The current confinement layer is arranged at a position where a strain in the selectively oxidized portion influences the strained active layer.

15 Claims, 5 Drawing Sheets

SURFACE EMITTING LASER DEVICE

CROSS-REFERENCE TO RELATED APPLICATIONS

The present application claims priority to and incorporates by reference the entire contents of Japanese priority document 2007-052006 filed in Japan on Mar. 1, 2007.

BACKGROUND OF THE INVENTION

1. Field of the Invention

The present invention relates to a vertical cavity surface emitting laser device.

2. Description of the Related Art

It is considered that in future, a large number of surface emitting laser (VCSEL) devices that emit a laser light in a wavelength band of 1000 nm to 2500 nm with an operating speed equal to or higher than 10 Gbps will be required in the fields of optical interconnection and optical communication. As a conventional surface emitting laser device, a vertical cavity surface emitting laser device in which a distributed Bragg reflector (DBR) laser is built by forming an active layer between an upper and a lower multilayer reflectors made of semiconductor and forming a current confinement layer that confines the current path to improve current injection efficiency has been disclosed (see Japanese Patent Application Laid-Open No. 2005-252032). The current confinement layer is formed by selectively oxidizing a layer made of AlAs, and includes a current confining portion in a circular shape made of AlAs disposed in the center and a selectively oxidized portion made of oxidized aluminum disposed around the current confining portion.

Meanwhile, a surface emitting laser device for a long wavelength band formed with an active layer in a multiple quantum well structure made of GaInNAs-based materials on a GaAs substrate is also attracting attention. For example, a GaInNAs-based active layer for the wavelength band of 1.3 μm to 1.55 μm is a so-called high strain system with an amount of compressive strain of the quantum well layer equal to or more than 2%. Therefore, in general, from a viewpoint of the critical film thickness of the quantum well layer, the thickness of a barrier layer is 20 nm to 25 nm, and the number of quantum wells is two to three. The active layer, for example, is formed by alternately growing a quantum well layer of $Ga_{0.63}In_{0.37}N_{0.01}As_{0.99}$ with a thickness of 7.3 nm, and a barrier layer made of GaAs with a thickness of 20 nm to 25 nm, and the number of the quantum well is three.

With a surface emitting laser device for a long wavelength band that adopts an active layer in a quantum dot structure made of InAs or InGaAs, a barrier layer has the same thickness as the above, because the quantum dot is highly strained.

Accordingly, the conventional surface emitting laser device with the highly strained active layer has a high threshold current and a low optical output, thereby operating in a low speed without increasing the relaxation frequency.

By making the barrier layer thin and by disposing each quantum well layer close to a position where the amplitude of an optical standing wave generated in an optical resonator is large, a modal gain can be increased because an optical confinement factor to the quantum well layer will be increased and the threshold current can be lowered (see A. W. Jackson, et al., "OC-48 capable InGaAsN vertical cavity lasers", Electronics Letters, vol. 37 No. 6, pp. 355-356 (2001)).

However, with the highly strained active layer, there is a problem that a dislocation such as a misfit dislocation tends to occur to the quantum well layer, when the thickness of the barrier layer is made thin, thereby degrading the reliability of the device. As a result, the thickness of the barrier layer had to be thick, and the modal gain could not be increased.

SUMMARY OF THE INVENTION

It is an object of the present invention to at least solve the above-described problems.

A surface emitting laser device according to the present invention includes a substrate; an optical resonator arranged on the substrate, the optical resonator including a lower multilayer reflector and an upper multilayer reflector; a strained active layer arranged in the resonator, the strained active layer having a multiple quantum well structure formed with a quantum well layer and a barrier layer; and a current confinement layer arranged on an upper side of the strained active layer, the current confinement layer including a selectively oxidized portion. The current confinement layer is arranged at a position where a strain in the selectively oxidized portion influences the strained active layer.

Furthermore, a surface emitting laser device according to the present invention includes a substrate; an optical resonator arranged on the substrate, the optical resonator including a lower multilayer reflector and an upper multilayer reflector; a strained active layer arranged in the resonator, the strained active layer having a quantum dot structure formed with a quantum dot layer in which a quantum dot portion is formed and a barrier layer; and a current confinement layer arranged on the strained active layer, the current confinement layer including a selectively oxidized portion. The current confinement layer is arranged at a position where a strain in the selectively oxidized portion influences the strained active layer.

The above and the other objects, features, advantages, and technical and industrial significance of the present invention will be better understood by reading the following detailed description of the present invention, when considered in connection with the accompanying drawings.

DETAILED DESCRIPTION OF THE PREFERRED EMBODIMENTS

Exemplary embodiments of a surface emitting laser device according to the present invention will be explained in detail below with reference to FIGS. 1 to 8. The present invention is not limited to the embodiments, and various modifications may be made without departing from the scope of the invention.

First Embodiment

A surface emitting laser device according to a first embodiment of the present invention will now be explained. The surface emitting laser device according to the first embodiment is a surface emitting laser device in which a strained active layer having a multiple quantum well structure made of GaInNAs is grown on a substrate made of GaAs with an oscillation wavelength of 1300 nm.

Figure 1:
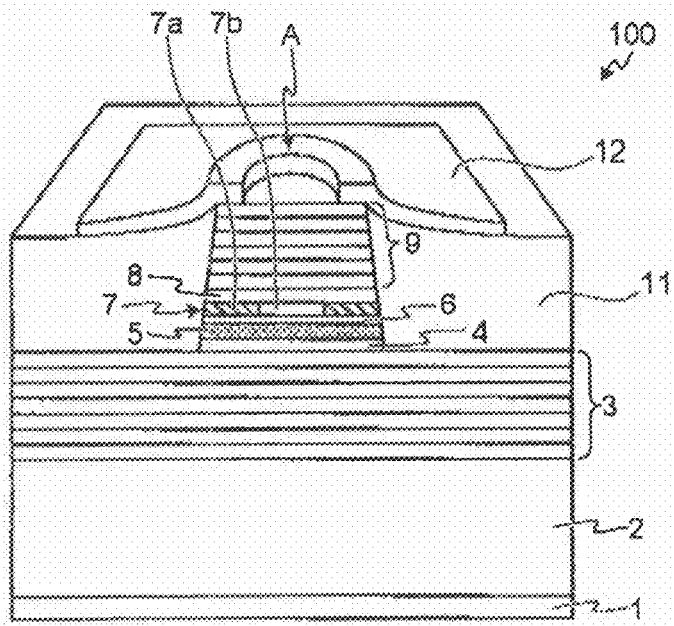
FIG. 1 is a schematic sectional perspective view of a surface emitting laser device according to a first embodiment of the present invention.
Figure 2:
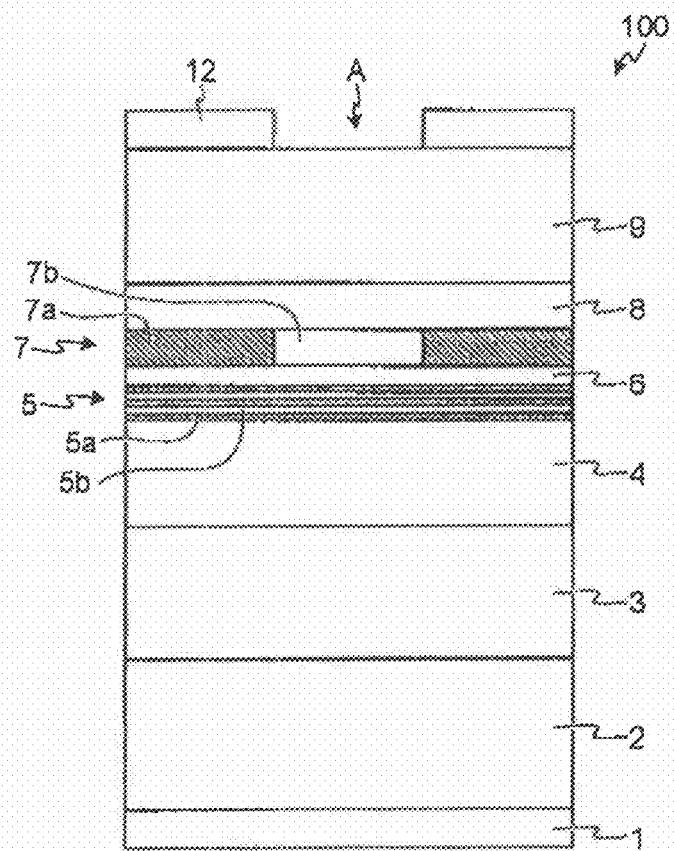
FIG. 2 is a schematic sectional view of a growth structure of the surface emitting laser device shown in FIG. 1.

FIG. 1 is a schematic sectional perspective view of the surface emitting laser device according to the first embodiment. FIG. 2 is a schematic sectional view of a growth structure of the surface emitting laser device shown in FIG. 1. As shown in FIGS. 1 and 2, in the surface emitting laser device 100 according to the first embodiment, an n-GaAs substrate 2 with a plane orientation (100), an n-DBR mirror 3 that is a lower multilayer reflector, an n-GaAs cladding layer 4, a strained active layer 5, a p-GaAs cladding layer 6, a current confinement layer 7, a p-GaAs cladding layer 8, and a p-DBR mirror 9 that is an upper multilayer reflector are sequentially formed. The n-GaAs cladding layer 4 to the p-DBR mirror 9 are in a mesa post structure and the mesa post, for example, is embedded with a polyimide 11. A p-side electrode 12 that includes an opening A is formed on the top surface of the p-DBR mirror 9 and the polyimide 11, and an n-side electrode 1 is formed under the surface of the n-G as substrate 2.

On the surface of the n-GaAs substrate 2, an n-GaAs buffer layer of which the carrier concentration is $1 \times 10^{18}$ cm$^{-3}$ is grown at a thickness of 0.1 μm to smooth the surface. When the oscillation wavelength of the surface emitting laser 100 is λ and the refractive index of each constituent material is n, the n-DBR mirror 3 is formed with 35.5 pairs of a multilayer film made of a pair of an n-type $Al_{0.9}Ga_{0.1}As$ layer and an n-type GaAs layer with thicknesses of λ/4n. The p-DBR mirror 9 is formed with 23 pairs of a multilayer film made of a pair of a p-type Al0.9Ga0.1As layer and a p-type GaAs layer with thicknesses of λ/4n. When an average refractive index of each layer is N, the n-GaAs cladding layer 4 to the p-GaAs cladding layer 8 are formed so that the total thickness is λ/N. Accordingly, an optical resonator that has a resonator length of λ/N is formed between the n-DBR mirror 3 and the p-DBR mirror 9.

The strained active layer 5 is formed by alternately growing three quantum well layers 5a made of $Ga_{0.63}In_{0.37}N_{0.01}As_{0.99}$ with the thickness of 7.3 nm, and two barrier layers 5b made of GaAs with the thickness of 8 nm. The strained active layer 5 is disposed at the position where the quantum well layer 5a in the center is apart from the top surface of the n-DBR mirror 3 for λ/2N. In other words, in the first embodiment, the strained active layer 5 is grown at the position where the amplitude of the optical standing wave within the optical resonator is large, that is, at the center of the optical resonator that corresponds to a position of an antinode of the optical standing wave.

The current confinement layer 7 includes a selectively oxidized portion 7a of which the thickness is 15 nm and made of oxidized aluminum formed by selective oxidation, and a current confining portion 7b in a circular disk made of p-$Al_{0.98}GaAs$ as a non-selectively oxidized portion and placed approximately in the center within the selectively oxidized portion 7a. The center of the current confinement layer 7 is disposed at a position where the distance is 94 nm apart from the center of the strained active layer 5. The selectively oxidized portion 7a reduces volume during the selective oxidation and has a tensile strain.

When an active layer is made of the same composite material as the strained active layer 5, the number of the quantum well is three, and the thickness of the respective barrier layers are 8 nm, the theoretical critical film thickness of the quantum well layer is approximately 5.9 nm. However, in the surface emitting laser device 100 according to the first embodiment, the current confinement layer 7 is disposed at the position where the influence of the strain within the selectively oxidized portion 7a reaches the strained active layer 5. Accordingly, the strain within the strained active layer 5 is fully compensated by the strain within the selectively oxidized portion 7a, thereby suppressing the generation of dislocation, even if the thickness of the respective quantum well layers 5a is 7.3 nm that is above the critical film thickness.

Figure 3:
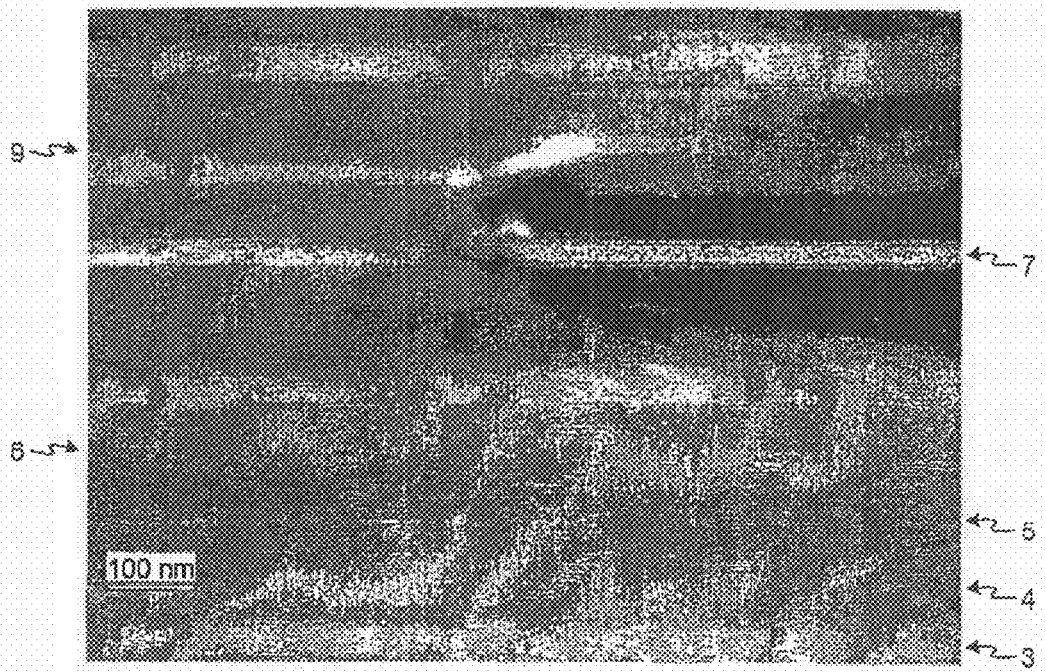
FIG. 3 is a TEM image of a cross section of a surface emitting laser device that includes the same configuration as the surface emitting laser device shown in FIG. 1.

FIG. 3 is a TEM image of a cross section of a surface emitting laser device that has the same configuration as the surface emitting laser device shown in FIG. 1. In FIG. 3, the horizontal stripes that seem to be in parallel show the n-DBR mirror 3, the n-GaAs cladding layer 4, the strained active layer 5, the p-GaAs cladding layer 6, the current confinement layer 7, and the p-DBR mirror 9. The current confinement layer 7 is formed within the p-DBR mirror 9. In the current confinement layer 7, a portion with uniform brightness placed at the left side from the center of the photograph is the current confining portion, and a portion with uneven brightness placed at the right side is the selectively oxidized portion. The dark and light shadings in waveform that can be seen around the selectively oxidized portion reflect the strain that occurred thereat due to the strain stress in the selectively oxidized portion.

As shown in FIG. 3, the strain is generated within the distance approximately 300 nm from the current confinement layer 7. In other words, when the current confinement layer 7 is disposed at a position equal to or less than 300 nm from the strained active layer 5, the advantage of fully compensating the strain within the strained active layer 5 by the strain within the selectively oxidized portion 7a can sufficiently be obtained. It should be noted that the distance is preferably equal to or more than 50 nm.

An operation of the surface emitting laser device 100 will now be explained. In the surface emitting laser device 100, when a voltage is applied between the n-side electrode 1 and the p-side electrode 12, and current is injected, the current confinement layer 7 increases current density by restricting the current path. Each of the quantum well layers 5a of the strained active layer 5 injected with the current with high current density emits light in a 1300-nm band. Then, the optical resonator formed by the n-DBR mirror 3 and the p-DBR mirror 9 causes laser oscillation to the emitted light at the wavelength of 1300 nm, and emits laser light of the wavelength of 1300 nm from the opening A.

Figure 4:
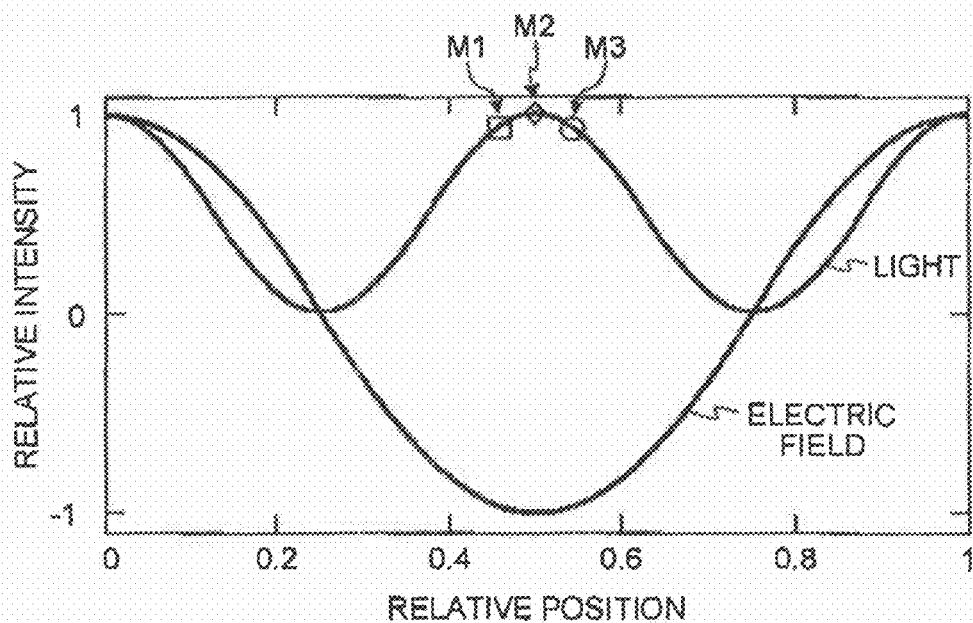
FIG. 4 is a schematic diagram or intensity distributions of light generated within an optical resonator of the surface emitting laser device shown in FIG. 1 and electric field of the light.

FIG. 4 is a schematic diagram of an intensity distribution of light and an electric field of light generated within the optical resonator of the surface emitting laser device 100. The horizontal axis shows a relative position within the optical resonator when λ/N is 1, 0 shows the position of the upper surface of the n-DBR mirror 3, and 1 shows the position of the lower surface of the p-DBR mirror 9. The vertical axis shows a relative intensity of light or electric field when the maximum amplitude is 1. The symbols M1 to M3 respectively show the position of each of the quantum well layers $5a$ of the strained active layer 5 in the optical resonator. The interval between the symbols M1 to M3 is 8 nm. As shown in FIG. 3, each of the quantum well layers $5a$ is placed close to the position of the antinode of the optical standing wave, thereby increasing the optical confinement factor.

With a simulation calculation, in the surface emitting laser device 100, the optical confinement factor becomes 2.3%, and a threshold current density decreases to 2 kA/cm$^2$ when the reflectivity of an optical emission surface that is the upper surface of the p-DBR mirror 9 is 99.8%. When the interval between each of the quantum well layers $5a$ is 20 nm, the optical confinement factor is 2%, and the threshold current density is 3 kA/cm$^2$ when the reflectivity of the optical emission surface is 99.8%.

As described above, the current confinement layer 7 is disposed at the position where the distance is 94 nm apart from the strained active layer 5. Because $\lambda$ is 1300 nm and N is 3.45, $\lambda/4N$ is 94 nm. In other words, the current confinement layer 7 is placed at the position where the distance from the strained active layer 5 is $\lambda/4N$, that is, at the relative position of 0.75 in FIG. 4. In other words, the current confinement layer 7 is placed at the node position where the amplitude of the optical standing wave is small. As a result, the light that forms the standing wave will not be absorbed or scattered by the selectively oxidized portion $7a$ of the current confinement layer 7, thereby decreasing the threshold current density of the surface emitting laser device 100 without fail. The same advantage can be obtained even when the distance to the strained active layer 5 of the current confinement layer 7 is $3\lambda/4N$. In this case, because the distance is sufficiently close to the strained active layer 5, the advantage of suppressing leak current by blocking the current can also be maintained. The current confinement layer 7 may be placed at the position deviated from the node position, to an extent so as the light that virtually forms the standing wave will not be absorbed or scattered by the selectively oxidized portion $7a$ of the current confinement layer 7.

To sufficiently enlarge the optical confinement factor, the thickness of the barrier layer $5b$ is preferably equal to or less than 10 nm. To prevent the generation of dislocation in the quantum well layer $5a$, the thickness of the barrier layer $5b$ is preferably equal to or more than 5 nm.

A manufacturing method of the surface emitting laser device 100 according to the first embodiment will now be explained. The n-DBR mirror 3, the n-GaAs cladding layer 4, the strained active layer 5, the p-GaAs cladding layer 6, the current confinement layer 7, the p-GaAs cladding layer 8, and the p-DBR mirror 9 are sequentially grown epitaxially by using, for example, any one of a molecular beam epitaxy (MBE) method, a gas source MBE method, a chemical molecular beam epitaxy (CBE) method, and a metal-organic chemical vapor deposition (MOCVD).

Then, by using a plasma CVD method, a silicon nitride film is formed on a growing surface of the p-DBR mirror 9, and a circular pattern of a diameter of approximately 30 μm is transferred thereon by a photolithography technique using a photoresist. With the transferred circular resist mask, the silicon nitride film is etched by a reactive ion etching (RIE) method using $CF_4$ gas. A mesa post in a columnar structure with the diameter of approximately 30 μm is formed, by etching until reaching the n-DBR mirror 3, by a reactive ion beam etching (RIBE) method using chlorine gas. The etching by the RIBE method is stopped at the depth within the n-DBR mirror 3.

Next, at this state, by heating to 400° C. in a water vapor atmosphere and left to stand, the current confinement layer 7 is selectively oxidized. In this manner, the selectively oxidized portion $7a$ is formed. The current confining portion $7b$ that the selectively oxidized portion $7a$ is not formed as a non-selectively oxidized portion has a diameter from 3 μm to 10 μm, and, for example, may be 6 μm. When the silicon nitride film is completely removed using the RIE method, the surrounding of the mesa post is embedded with the polyimide 11.

A new silicon nitride film is then formed on the entire surface by the plasma CVD method. The silicon nitride film is removed in a predetermined shape, and forms the p-side electrode 12 made of Ti/Pt/Au. After polishing the n-GaAs substrate 2 to approximately 200 μm, deposit the n-side electrode 1 made of AuGeNi/Au on the surface, and anneal at approximately 400° C. in a nitrogen atmosphere in the end.

When the characteristics of the surface emitting laser device 100 manufactured by the method is measured, at a temperature of 25° C., the threshold current was 1 mA, the slope efficiency was 0.25 W/A, the 3-dB bandwidth at a small signal modulation was 10 GHz, and the maximum CW oscillation temperature was equal to or more than 100° C. In other words, the surface emitting laser device 100 has a low threshold current, can be operated with high speed, and can be operated in high temperature. Moreover, the surface emitting laser device 100 can be driven for a million hours at an environmental temperature of 25° C. and has a long life with high reliability.

For a comparison, the characteristics of a surface emitting laser device that has the same configuration as the surface emitting laser device according to the first embodiment, but the thickness of each barrier layer is 20 nm, and the distance of the current confinement layer from the strained active layer is 630 nm, in other words, $7\lambda/4N$, is also measured. At a temperature of 25° C., the threshold current was 1.5 mA, the slope efficiency was 0.25 W/A, the 3-dB bandwidth at a small signal modulation was 7 GHz, and the maximum CW oscillation temperature was 80° C.

As explained in the above, in the surface emitting laser device 100 according to the first embodiment, the current confinement layer 7 is disposed at the position where the influence of the strain within the selectively oxidized portion $7a$ reaches the strained active layer 5, thereby enabling the low threshold current with high reliability.

Second Embodiment

A surface emitting laser device according to a second embodiment of the present invention will now be explained. The surface emitting laser device according to the second embodiment has the same configuration as the surface emitting laser device according to the first embodiment, except that the strained active layer is in a quantum-dot structure made of InAs.

Figure 5:
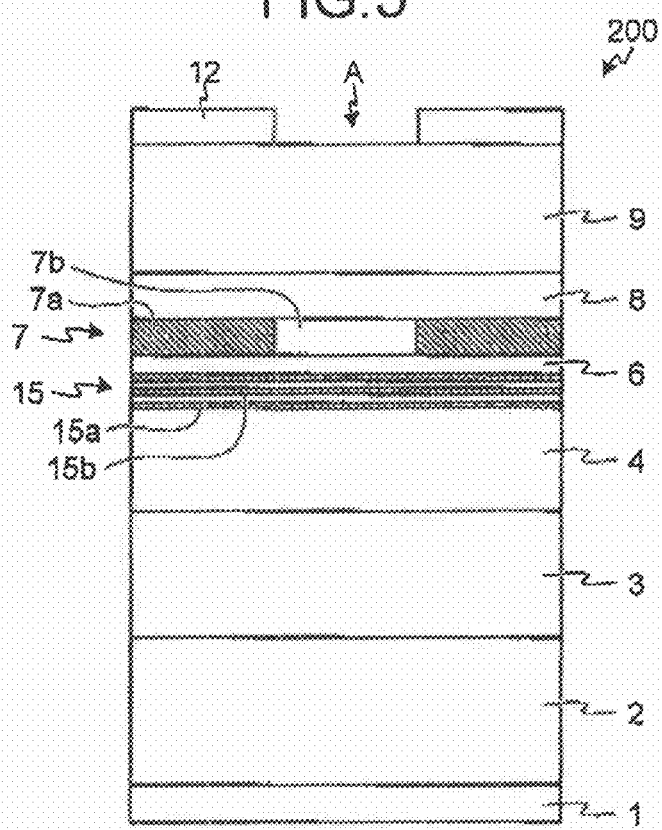
FIG. 5 is a schematic sectional view of a growth structure of a surface emitting laser device according to a second embodiment of the present invention.
Figure 6:
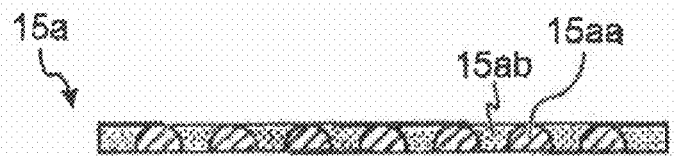
FIG. 6 is a schematic sectional view of a quantum dot layer of the surface emitting laser device shown in FIG. 5.

FIG. 5 is a schematic sectional view of a growth structure of the surface emitting laser device according to the second embodiment. As shown in FIG. 5, in the surface emitting laser device 200 according to the second embodiment, a strained active layer 15 is formed by alternately growing three quantum dot layers $15a$ and two barrier layers $15b$. FIG. 6 is a schematic sectional view of the quantum dot layer $15a$ of the surface emitting laser device 200. As shown in FIG. 6, the quantum dot layer $15a$ includes a quantum dot portion $15aa$ with the diameter approximately 15 nm in a barrier region $15ab$ at a density of approximately $3\times10^{10}$ cm$^{-2}$. The barrier layers $15b$ are made of GaAs with the respective thickness of 8 nm. The quantum dot layers 15a have the respective thickness of approximately 7 nm, the quantum dot portion 15aa is made of InAs, and the barrier region 15ab is made of GaAs.

The strain amount of the quantum dot portion 15aa is 7% that is highly strained. Similar to the surface emitting laser device 100 according to the first embodiment, the current confinement layer 7 is disposed at the position where the distance is 94 nm apart from the strained active layer 15, so that the influence of the strain within the selectively oxidized portion 7a reaches thereto. Accordingly, the strain within the active layer 15 is fully compensated by the strain within the selectively oxidized portion 7a, thereby suppressing the generation of dislocation even if the thickness of the respective quantum dot layers 15a is equal to or more than the critical film thickness of 5 nm.

The surface emitting laser device 200 can be manufactured by the same method as the surface emitting laser device 100 according to the first embodiment. To manufacture the active layer 15 here, after epitaxially growing the n-GaAs cladding layer 4, the material of InAs is supplied at an amount of approximately 2.5 monolayers, thereby growing the InAs in a three-dimensional direction. Then, form the quantum dot portion 15aa, and epitaxially grow the barrier region 15ab made of GaAs.

As described above, in the surface emitting laser device 200 according to the second embodiment, the current confinement layer 7 is disposed at the position where the strain within the selectively oxidized portion 7a reaches the strained active layer 15, thereby enabling the low threshold current with high reliability.

Third Embodiment

A surface emitting laser device according to a third embodiment of the present invention will now be explained. The surface emitting laser device according to the third embodiment has the same configuration as the surface emitting laser device according to the first embodiment, and has the same advantage, except that a tunnel junction layer is formed between the upper multilayer reflector and the active layer.

Figure 7:
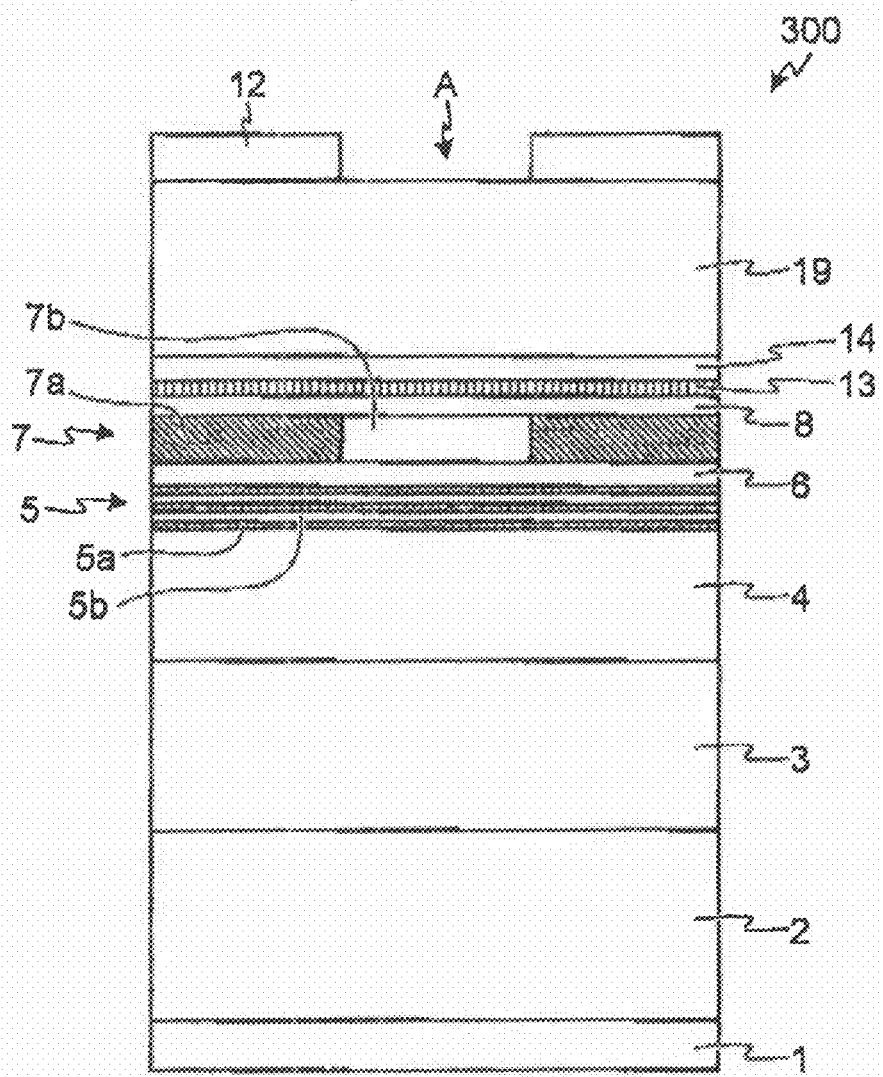
FIG. 7 is a schematic sectional view of a growth structure of a surface emitting laser device according to a third embodiment of the present invention.

FIG. 7 is a schematic sectional view of a growth structure of the surface emitting laser device according to the third embodiment. As shown in FIG. 7, the surface emitting laser device 300 according to the third embodiment differs from the surface emitting laser device 100 by including an n-DBR mirror 19 as the upper multilayer reflector and a tunnel junction layer 13 formed between the n-DBR mirror 19 and the strained active layer 5. An n-GaAs cladding layer 14 is also formed on the tunnel junction layer 13. In other words, the semiconductor layers grown above the tunnel junction layer 13 are n-type.

The tunnel junction layer 13 is sequentially formed with a $p^+$-GaAs layer that the carrier concentration is $1.5 \times 10^{20}$ cm$^{-3}$ with the thickness of 5 nm, an $n^+$-In$_{0.13}$Ga$_{0.87}$As layer that the carrier concentration is $5 \times 10^{19}$ cm$^{-3}$ with the thickness of 5 nm, and an $n^+$-GaAs layer that the carrier concentration is $5 \times 10^{19}$ cm$^{-3}$ with the thickness of 20 nm. The n-DBR mirror 19 is formed with 23 pairs of multilayer films made of a pair of the n-type Al$_{0.9}$Ga$_{0.1}$As layer and an n-type GaAs layer with the respective thickness of $\lambda/4n$.

With intervalence band absorption, the p-type semiconductor absorbs light of which the wavelength is equal to or more than 1000 nm. In the surface emitting laser device 300 according to the third embodiment, because the tunnel junction layer 13 is included, the upper multilayer reflector can be formed by a DBR mirror made of the n-type semiconductor. Compared with using the DBR mirror formed by the p-type semiconductor, the loss caused by absorption of light can be suppressed, thereby enabling to further decrease the threshold current. The tunnel junction layer 13 can be disposed in the upper multilayer reflector, instead of between the n-DBR mirror 19 and the strained active layer 5. The configuration and the composition of the tunnel junction layer 13 are appropriately adjusted depending on the position that is formed.

Such a tunnel junction layer, for example, is disclosed in non-patent literature by Naofumi Suzuki, et al., "1.1-μm band InGaAs VCSEL for optical interconnection", Shingakugiho, Vol. 105, No. 455, LQE2005-113 (2005-12), pp. 5-8.

Fourth Embodiment

A surface emitting laser device according to a fourth embodiment of the present invention will now be explained. The surface emitting laser device according to the fourth embodiment is different from the surface emitting laser devices according to the first to the third embodiments, at a point that the upper multilayer reflector is made of a dielectric multilayer film and at a point that the n-side electrode is disposed on the lower multilayer reflector.

Figure 8:
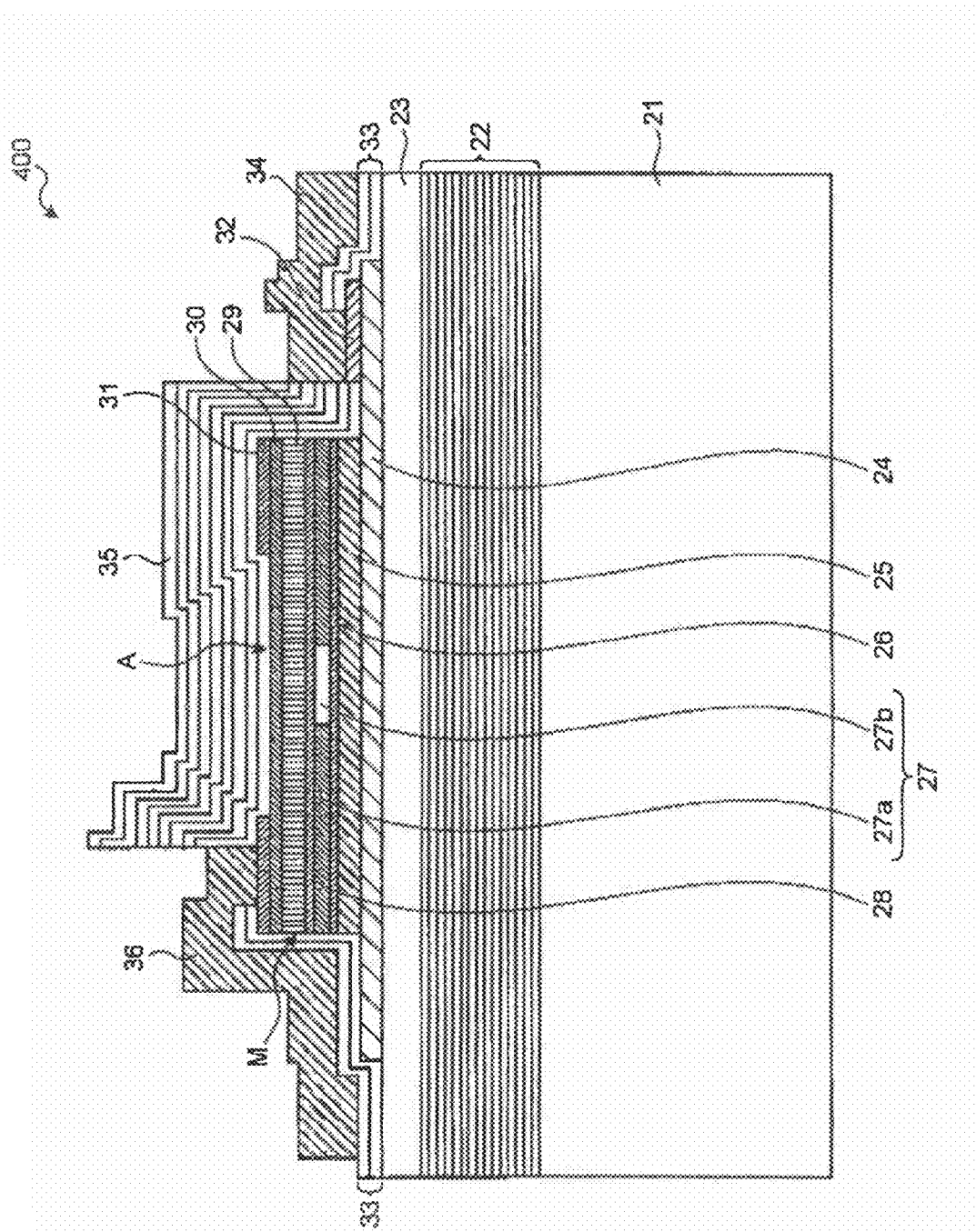
FIG. 8 is a schematic sectional view of a surface emitting laser device according to a fourth embodiment of the present invention.

FIG. 8 is a schematic sectional view of the surface emitting laser device 400 according to the fourth embodiment. As shown in FIG. 8, in the surface emitting laser device 400, a substrate 21, a lower DBR mirror 22 formed on the substrate 21, a buffer layer 23, an n-contact layer 24, a strained active layer 25, a lower graded composition layer 26, a current confinement layer 27 that includes a selectively oxidized portion 27a and a current confining portion 27b, an upper graded composition layer 28, a p-cladding layer 29, and a $p^+$-contact layer 30 are sequentially formed. The strained active layer 25 to the $p^+$-contact layer 30 forms a mesa post M in a cylinder.

The substrate 21 and the buffer layer 23 are made of undoped GaAs. The lower DBR mirror 22 is made of 34 pairs of GaAs/Al$_{0.9}$Ga$_{0.1}$As layer. The n-contact layer 24 is made of n-type GaAs. The strained active layer 25 and the current confinement layer 27 are respectively the same as the strained active layer 5 and the current confinement layer 7 of the surface emitting laser device 100 of the first embodiment. The lower graded composition layer 26 and the upper graded composition layer 28 are made of AlGaAs, and formed so that the Al composition increases in stages towards the current confinement layer 27 in the thickness direction. The p-cladding layer 29 and the $p^+$-contact layer 30 are respectively made of GaAs of p-type and $p^+$-type. A p-side electrode 31 in a circular ring that has an opening A in the center and coincides with the circumference of the mesa post M is formed on the mesa post M.

An upper DBR mirror 35 made of dielectric material is formed from the top of the p-side electrode 31 along the circumference of the mesa post M. The upper DBR mirror 35, for example, is made of 5 to 6 pairs of α-Si/SiO$_2$. However, the upper DBR mirror 35 may be made by a pair of SiN$_x$/SiO$_2$ or α-Si/Al$_2$O$_3$ so that an appropriate reflectivity of about 99% can be obtained depending on the refractive index of the material. The n-contact layer 24 is extended from below the mesa post M towards the outside in a radial direction, and an n-side electrode 32 in a semi-circular ring is formed on the surface. At a region where the upper DBR mirror 35 is not formed, a passivation film 33 that is made of dielectric material such as SiN$_x$ is formed to protect the surface.

An n-side wiring electrode 34 made of Au is formed so as to brought into contact with the n-side electrode 32, via an opening formed on the passivation film 33. A p-side wiring electrode 36 made of Au is also formed so as to brought into contact with the p-side electrode 31, via the opening formed on the passivation film 33. The n-side electrode 32 and the p-side electrode 31 are electrically connected to a not-shown current supply circuit provided outside, by the n-side wiring electrode 34 and the p-side wiring electrode 36, respectively.

In the surface emitting laser device 400, the center of the current confinement layer 27 is disposed at the position where the distance is 94 nm apart from the center of the strained active layer 25. In other words, the current confinement layer 27 is disposed at the position where the influence of the strain within the selectively oxidized portion 27a reaches the strained active layer 25. Therefore, the generation of dislocation can be suppressed, even if the respective thickness of the quantum well layers in the strained active layer 25 is equal to or more than the critical film thickness.

In the first to the third embodiments, the upper and the lower DBR mirrors are made of a semiconductor. It is preferable if at least one of the upper and the lower DBR mirrors is made of a dielectric multilayer film, because the one with high reflectivity can easily be made. The material for the dielectric multilayer film may be, for example, $SiO_2$, $TiO_2$, SiN, MgF, $Al_2O_3$, TiN, and $AlNSiO_2$.

In the first to the fourth embodiments, the current confinement layer is formed with AlAs and the selective oxidation is carried out thereto. However, any one of $Al_xGa_{1-x}As$ (x=0.95 to 0.998), AlInAs, and AlGaInAs may be grown and the selective oxidation may be carried out thereto. The current confinement layer may be formed by a superlattice made of an AlAs layer and a GaAs layer, and assuming that the thickness ratio of the AlAs layer and the GaAs layer is from 95:5 to 998:2, the selective oxidation may be carried out thereto.

In the first to the fourth embodiments, the laser oscillation wavelength is 1300 nm. However, if the surface emitting laser device includes the strained active layer according to the present invention, the laser oscillation wavelength may be from 1000 nm to 2500 nm. To make the laser oscillation wavelength from 1000 nm to 2500 nm, the laser oscillation wavelength is adjusted by a known method that adjusts a reflection wavelength of the DBR mirror, a resonator length, and a gain wavelength based on the laser oscillation wavelength, by using a GaAs substrate, an InP substrate, or a GaSb substrate.

In the first to the fourth embodiments, the active layer is disposed at the center of the optical resonator. However, the active layer may be disposed at a position of $m\lambda/2N$ (m: integer number) in the optical resonator. The current confinement layer may also be disposed at a position where the influence of the strain within the selectively oxidized portion reaches the strained active layer. Accordingly, the current confinement layer may be disposed directly above the strained active layer that includes a quantum well layer and a barrier layer, or may be disposed at a state that a layer of some sort is interposed therebetween.

In the first to the fourth embodiments, the layer number of the quantum well or the quantum dot layer of the active layer is 3, but the number may be two to eight. In other words, if the number of the quantum well layer or the quantum dot layer is two to eight, all the quantum well layers or the quantum dot layers can be disposed close to the antinode of the optical standing wave, thereby enabling to increase the modal gain.

In the first to the third embodiments, the n-type GaAs substrate is used for the substrate. However, a Semi-insulated substrate may be used.

In the first, the third, and the fourth embodiments, the substrate is made of GaAs and the quantum well layer is made of GaInNAs. However, the quantum well layer may be made of any one of GaInNAsSb, GaAsSb, and InGaAs, that are highly strained. Or, the substrate may be made of InP, and the quantum well layer may be made of any one of GaInAsP, AlGaInAs, and GaInNAsSb, that are highly strained.

In the second embodiment, the substrate is made of GaAs and the quantum dot portion is made of InAs. However, the substrate may be made of InP, and the quantum dot portion may be made of InGaAs.

In the first to the third embodiments, the lower multilayer reflector and the lower cladding layer are formed by the n-type semiconductor, the upper multilayer reflector and the upper cladding layer are formed by the p-type semiconductor, and the current confinement layer is formed above the active layer. However, the lower multilayer reflector and the lower cladding layer may be formed by the p-type semiconductor. Moreover, an embodiment may be made so that the influence of the strain of the current confinement layer may reach the active layer, by forming the current confinement layer under the active layer.

As described above, the surface emitting laser device according to the present invention is applicable and suitable in the fields of optical interconnection and optical communication.

The further advantages and modifications may easily be derived by those skilled in the art. Therefore, the present invention in its broader aspect is not limited to the specific detailed and representative embodiments shown and described as above. Accordingly, various modifications may be possible without departing from the spirit and scope of the general concept of the invention defined by the appended claims and the equivalents.

What is claimed is:

1. A surface emitting laser device, comprising:
   a substrate;
   an optical resonator arranged on the substrate, the optical resonator including a lower multilayer reflector and an upper multilayer reflector;
   a strained active layer arranged in the resonator, the strained active layer having a multiple quantum well structure formed with a quantum well layer and a barrier layer; and
   a current confinement layer arranged on an upper side of the strained active layer, the current confinement layer including a selectively oxidized portion, and being arranged at a position where a strain in the selectively oxidized portion compensates the strained active layer.

2. The surface emitting laser device according to claim 1, wherein the strain of the strained active layer is a compressive strain, and a thickness of the barrier layer is 5 nanometers to 10 nanometers.

3. The surface emitting laser device according to claim 1, wherein the strained active layer is located at an antinode of an optical standing wave generated in the optical resonator, and the current confinement layer is located at a distance of either one of $\lambda/4N$ and $3\lambda/4N$ from the strained active layer, where $\lambda$ is laser oscillation wavelength and N is average refractive index of the optical resonator.

4. The surface emitting laser device according to claim 1, wherein the current confinement layer is located at a distance equal to or less than 300 nanometers from the strained active layer.

5. The surface emitting laser device according to claim 1, wherein the substrate is made of GaAs, and the quantum well layer is made of any one of GaInNAs, GaInNAsSb, GaAsSb, and InGaAs.

6. The surface emitting laser device according to claim 1, wherein the substrate is made of InP, and the quantum well layer is made of any one of GaInNAsP, AlGaInAs, and GaInNAsSb.

7. The surface emitting laser device according to claim 1, wherein the strained active layer includes two to eight quantum well layers.

8. The surface emitting laser device according to claim 1, further comprising:
    a tunnel junction layer grown between an upper surface of the upper multilayer reflector and a lower surface of the lower multilayer reflector.

9. The surface emitting laser device according to claim 1, wherein at least a part of the upper multilayer reflector and the lower multilayer reflector is formed with a dielectric multilayer film.

10. The surface emitting laser device according to claim 1, wherein a laser oscillation wavelength is 1000 nanometers to 2500 nanometers.

11. The surface emitting laser device according to claim 1, wherein a semiconductor layer forming a non-selectively oxidized portion of the current confinement layer is made of $Al_xGa_{1-x}As$, where x=0.95 to 0.998.

12. The surface emitting laser device according to claim 1, wherein a semiconductor layer forming a non-selectively oxidized portion of the current confinement layer is formed with a superlattice made of an AlAs layer and a GaAs layer, and a thickness ratio of the AlAs layer and the GaAs layer is 95:5 to 998:2.

13. A surface emitting laser device, comprising:
    a substrate;
    an optical resonater arranged on the substrate, the optical resonator including a lower multilayer reflector and an upper multilayer reflector;
    a strained active layer arranged in the resonator, the strained active layer having a quantum dot structure formed with a quantum dot layer in which a quantum dot portion is formed and a barrier layer; and
    a current confinement layer arranged on the strained active layer, the current confinement layer including a selectively oxidized portion, and being arranged at a position where a strain in the selectively oxidized portion compensates the strained active layer.

14. The surface emitting laser device according to claim 13, wherein the substrate is made of either one of GaAs and InP, and the quantum dot portion is made of either one of InAs and InGaAs.

15. The surface emitting laser device according to claim 13, wherein the strained active layer includes two to eight quantum dot layers.

* * * * *